July 21, 1970 T. B. BLANCKE 3,521,179

AMPLIFIER WITH SOURCE VOLTAGE CONTROL

Filed April 2, 1968

INVENTOR

TIMOTHY B. BLANCKE

BY Arnold, Roylance, Kruger & Durkee

ATTORNEYS

United States Patent Office 3,521,179

Patented July 21, 1970

3,521,179

AMPLIFIER WITH SOURCE VOLTAGE CONTROL

Timothy B. Blancke, West Concord, Mass., assignor to Weston Instruments, Inc., Newark, N.J., a corporation of Delaware Filed Apr. 2, 1968, Ser. No. 718,042
Int. Cl. H03f 3/68
U.S. Cl. 330—30 4 Claims

ABSTRACT OF THE DISCLOSURE

A unity gain isolation amplifier is provided having the input and output circuits connected to provide an exact duplicate at the output of the signal provided to the input. First and second complementary type transistors are connected between the power-supply sources for the amplifier and the power-supply terminals of the amplifier. Resistive dividers are connected between the amplifier output and the power-supply sources, the midpoints of the dividers being connected to the control electrodes of the transistors to control their conductivity. The transistors control the power-supply voltages to the amplifier, allowing the power-supply voltages seen by the amplifier to follow the output voltage of the amplifier in a manner which reduces the voltage between the amplifier output terminal and both amplifier power-supply terminals. The power-supply source voltage can then be increased, permitting operation of the amplifier over a greater range of voltage swing than the maximum permissible voltage between the amplifier's power-supply terminals.

This invention relates to amplifier circuits and, more specifically, to amplifiers including output circuit means for controlling the power-supply voltage to the amplifier in accordance with signal amplitude.

In measuring systems and in other apparatus it is frequently desirable to provide isolation between successive portions of the apparatus. Such isolation can be provided to some degree by either a passive or an active network, depending upon the particular requirements of the system and, especially, on the necessary accuracy.

However, where it is necessary to provide the isolation in a system wherein accuracy is the prime importance, the isolation circuit must reproduce the signal at its output in exactly the same form in which it was received. This exact reproduction is not feasible with a passive circuit because of inherent losses. An active circuit can be used more successfully, but must be designed so that it does not introduce any distortion.

One object of the present invention is to provide amplifier circuit means having control circuits connected to provide power-supply voltages which are variable and are controlled by signal amplitude.

A further object is to provide a unit gain isolation amplifier connected to exactly reproduce an input signal at a pair of output terminals wherein transistor circuit means are connected between the DC sources for the amplifier and the amplifier itself to control source voltage magnitude. The output voltage range can then exceed the maximum voltage which can be applied to the amplifier terminals without damaging the amplifier.

Broadly described, apparatus in accordance with the invention includes a high-gain differential amplifier of a conventional type having two input terminals, an output terminal, and two power terminals to which positive and negative DC sources are connected for proper operation. The inverting input terminal is connected to the output terminal to provide a feedback signal, the noninverting input terminal being connected to a source of input signals. This connection allows the amplifier circuit to "float,"

the error to the input of the amplifier being the difference between the input and output signals which is quite small due to the high gain of the amplifier. The DC power-supply terminals for the amplifier are connected through control circuits which are also connected to the amplifier output and are responsive to changes in signal amplitude to control the instantaneous power-supply voltage provided to the amplifier. With this arrangement, the maximum power-supply voltage connected to the control circuits can be made larger, the control circuits acting to prevent the voltage being applied across the amplifier power-supply terminals from exceeding the rated limits but allowing the total voltage excursion at the output to be greater than would be possible without the control circuits.

In order that the manner in which the foregoing and other objects are attained in accordance with the invention can be understood in detail, a particularly advantageous embodiment thereof will be described with reference to the accompanying drawings, which form a part of this specification and wherein.

Figure 1:
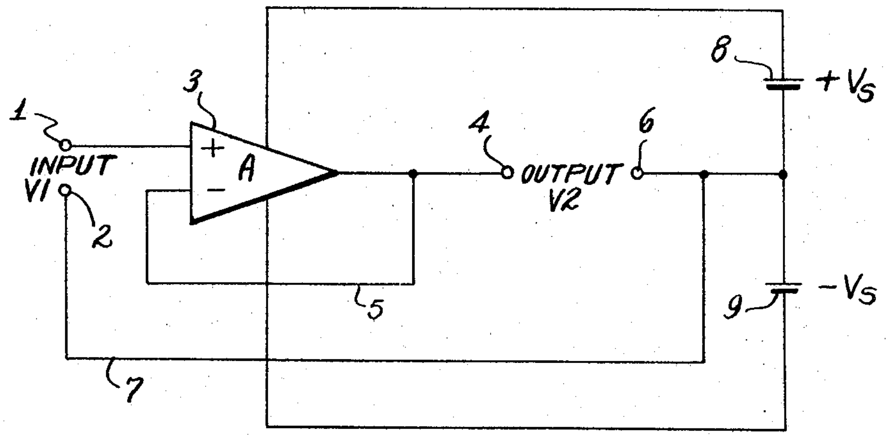
FIG. 1 is a schematic diagram of a basic unit gain isolation amplifier.

In FIG. 1, an input signal V1 is applied to network input terminals 1 and 2. Terminal 1 is connected to the noninverting (+) input terminal of a conventional high-gain differential amplifier 3. The output terminal of amplifier 3 is connected to a network output terminal 4 and, via a conductor 5, to the other input terminal of the amplifier.

Input terminal 2 is connected to a second output terminal 6 by a conductor 7, terminals 2 and 6 and conductor 7 constituting a common point, common to both the input and the output of the network. A positive DC voltage source, shown in FIG. 1 as a battery 8, is connected between the common point and the positive source input terminal of amplifier 3. A negative DC voltage source 9 is similarly connected between the common point and the negative source terminal of amplifier 3. It will be recognized that the term "source terminal" as used herein represents a point on or in the amplifier to which a positive or negative DC power supply is connected to provide the necessary voltage and current for amplifier operation.

The circuit of FIG. 1 is suitable for discussing the basic operation leading to the present invention. Amplifier 3 can be any conventional high-gain differential amplifier such as, for example, a Model $\mu$A709 integrated-circuit amplifier manufactured by the Fairchild Semiconductor Company, a division of Fairchild Camera and Instrument Corporation, Mountain View, Calif. As will be recognized by those skilled in the art, an amplifier of this general type is characterized by high internal gain, the amplifier being capable of accepting two input signals and providing, at the output terminal, an amplified version of the difference between the two input signals. With the output terminal connected to one of the input terminals as in FIG. 1, the amplifier produces an output which changes in accordance with the instantaneous difference between the signals at the two input terminals, as the signal applied to terminal 1 changes. For example, an input signal of 2 volts applied at terminal 1 provides a difference signal of 2 volts, assuming no prior signal and no drift. The amplifier produces a signal at the output terminal which quickly reaches 2 volts. This is fed back to the other input terminal, eliminating the difference at the input. Thus the output of the amplifier continuously follows the signal applied to terminal 1 and, because of the extremely high gain, the output signal V2 appearing between terminals 4 and 6 is substantially equal to the input signal V1 applied to terminals 1 and 2. This is the most desirable set of circumstances for the system to operate as a unity gain system, the main function being isolation between terminals 1 and 4.

It will be recognized that, for the system to operate as desired, the output signal V2 must not include distortion due to limiting within the amplifier. However, when the voltage applied to the input terminals is characterized by positive and negative excursions greater than the voltage sources 8 and 9, limiting will occur resulting in distortion of the signal. Thus, for example, if the peak-to-peak voltage applied to terminals 1 and 2 is two volts and each of sources 8 and 9 is 1.5 volts, no limiting will occur. However, if, with the same sources, the input signal reaches four volts peak-to-peak, limiting will necessarily occur and the desired precise reproduction will not exist.

The most obvious remedy for this situation would be to increase the size of voltage sources 8 and 9. However, it is not possible to increase the size of the sources beyond the design limits of the amplifier which are rather rigid especially in the case of integrated circuit amplifiers with which this invention is especially useful.

Figure 2:
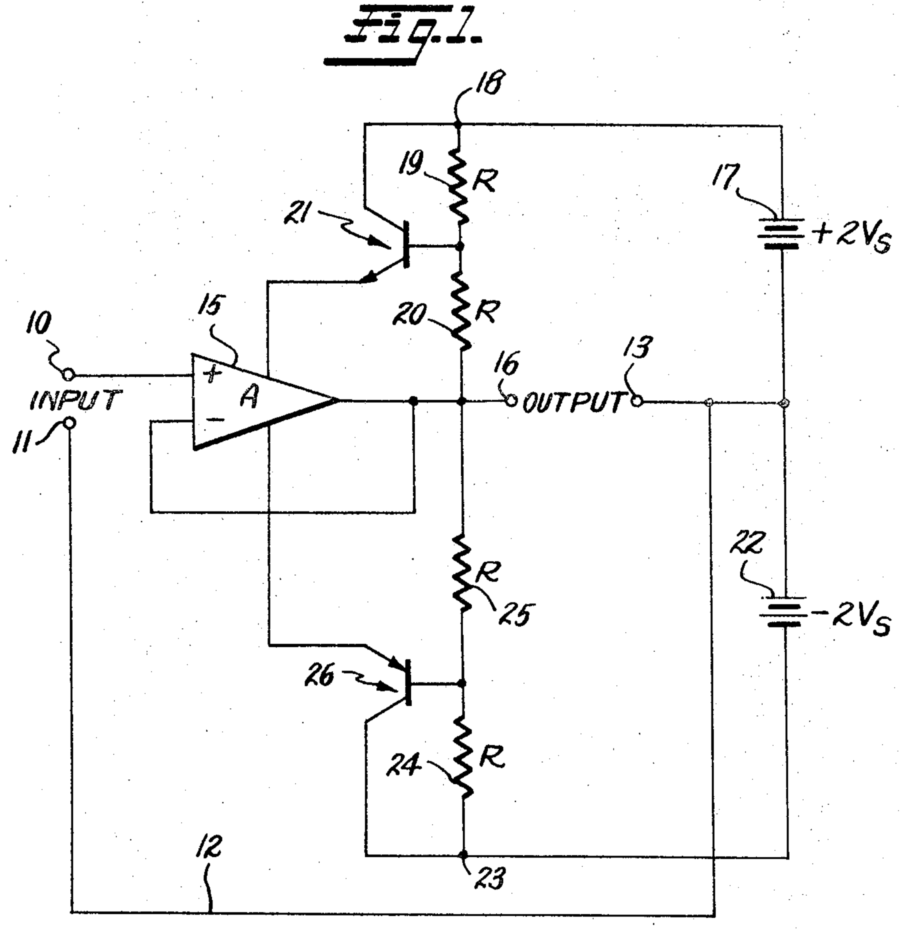
FIG. 2 is a schematic diagram of a unity-gain isolation amplifier incorporation in the present invention.

To overcome this disadvantage, the circuit of FIG. 2 provides control circuits to vary the source voltages as applied at the amplifier source terminals in accordance with the requirement as dictated by the output signal. In FIG. 2, the input signal V1 is applied to terminals 10 and 11, terminal 11 being the common point which is connected by a conductor 12 to an output terminal 13. Input terminal 10 is connected to one input terminal of a high gain differential amplifier 15 which can be the same kind of amplifier as amplifier 3. The output terminal of amplifier 15 is connected to the other input terminal of the amplifier and to a floating network output terminal 16.

The positive voltage supply for amplifier 15 includes a voltage source, shown in FIG. 2 as a battery 17, which is connected between the common point at output terminal 13 and a junction 18. A voltage-divider circuit, including the series connection of a resistor 19 and a resistor 20, is connected between junction 18 and the output terminal 16 of amplifier 15. The collector electrode of a conventional NPN transistor indicated generally at 21 is connected to junction 18, the base electrode of transistor 21 being connected to the junction between resistors 19 and 20, and the emitter electrode of the transistor being connected to the positive power-supply terminal of amplifier 15.

The negative supply for amplifier 15 includes a negative DC source, shown in FIG. 2 as a battery 22. The negative terminal of battery 22 is connected to a junction 23 which is connected to one end of a voltage divider circuit including the series connection of a resistor 24 and a resistor 25. The collector electrode of a conventional PNP transistor indicated generally at 26 is connected to junction 23, the base electrode of transistor 26 being connected to the junction between resistors 24 and 25 and the emitter electrode of transistor 26 being connected to the negative source terminal of amplifier 15.

The operation of the circuit of FIG. 2 can be described, first, by assuming no input signal, in which case the base electrodes of transistors 21 and 26 are provided with a voltage which is substantially smaller than the supply voltages, allowing the transistors to conduct partially, the degree of conduction being determined by the characteristics of the transistors themselves and also by the internal characteristics of amplifier 15. Proper selection of the value R of resistors 19, 20, 24 and 25 establishes the conductivity at a level which will allow the voltages at the source terminals of amplifier 15 to be not in excess of the rated voltage for the particular amplifier chosen. Thus, in a quiescent state, even though sources 17 and 22 can be greater than the rated amplifier voltages, the voltages applied to the amplifier itself are within ratings. If, for example, the sources are doubled and the resistor values are all equal to each other, the voltage between the two base electrodes of the two transistors is approximately equal to the voltage of one of the sources ($2V_S$), the voltage between the two emitter electrodes (i.e., between the source terminals) being slightly less than that, and therefore slightly less than the equivalent voltage in FIG. 1, because of the base-emitter voltage drops of the transistors themselves.

As the signal applied to terminal 10 increases, the voltage at the amplifier output terminal also increases, as previously described. As a result, the voltage at the base electrode of transistor 21 increases, and the voltage at the base electrode of transistor 26 decreases in absolute value relative to the emitter electrode. Thus, the voltage at the positive source terminal of the amplifier (at the emitter of transistor 21) increases and the voltage at the negative source terminal decreases (moves more positive), maintaining a substantially constant voltage between the two source terminals. In essence, the voltage level of the entire amplifier and voltage supply system moves in a positive direction relative to common terminal 13, maintaining the supply level to the amplifier within the prescribed rating limits.

From the above discussion it will be seen that a negative input signal has the converse effect, allowing the amplifier and its source voltages to float in a negative direction, still maintaining the rated voltages.

It can also be seen that common-mode errors of the embodiment of FIG. 2 will be only half as great as they would have been if floating power supplies had been connected to the output terminal 4 of FIG. 1 instead of terminal 6 as shown in FIG. 1.

Modifications which will appear from the description of the invention may include the use of different supply voltages with other resistor ratios, and the use of other types of active voltage followers rather than bipolar transistors.

While an advantageous embodiment has been chosen to illustrate the invention, it will be understood by those skilled in the art that various changes and modifications can be made therein without departing from the scope of the invention.

What is claimed is:

1. A unity gain isolation amplifier apparatus comprising, a high gain differential amplifier having two input terminals, an output terminal, and positive and negative voltage source terminals, one of said input terminals being connected directly to said amplifier output terminal, the other of said input terminals being connectable to a source of input signals; a source of positive DC voltage; a source of negative DC voltage; first control circuit means connected between one of said voltage sources and a corresponding one of said voltage source terminals for controlling the corresponding supply voltage provided said amplifier, and second control circuit means connecting the other voltage source to the other amplifier source terminal, said first control circuit means including, a first voltage divider circuit connected between the one voltage source and said amplifier output terminal, and a first transistor having a base electrode connected to the midpoint of said divider circuit, an emitter electrode connected to said one voltage source terminal of said amplifier and a collector electrode connected to said one voltage source, and said second circuit means including, a voltage divider circuit connected between the other voltage source and said amplifier output terminal; and a second transistor having a base electrode connected to the midpoint of said second divider circuit, an emitter electrode connected to said other amplifier source terminal and a collector electrode connected to said other voltage source.

2. Apparatus according to claim 1 wherein said first and second transistors are of opposite conductivity types.

3. Apparatus according to claim 1 wherein each of said first and second voltage dividers includes two resistors connected in series circuit relationship, and the resistance values of the four resistors in said two dividers are equal to each other.

4. An isolation network comprising the combination of a high gain differential amplifier having two input terminals, two voltage source terminals and an output terminal, one of said input terminals constituting one of the network terminals, said output terminal constituting a second network terminal; a common input-output terminal constituting a third of the three network terminal; circuit means interconnecting the other one of said two amplifier input terminals and said amplifier output terminal for providing a feedback circuit; a positive source of voltage; a negative source of voltage; first voltage control circuit means connected to said positive voltage source and including; first and second resistors of substantially equal value connected in series circuit relationship between said amplifier output terminal and said positive voltage source; and an NPN type transistor having an emitter-collector circuit connected between said amplifier source terminal and said positive voltage source, the base electrode of said transistor being connected to the junction of said first and second resistors; and second voltage control circuit means connected to said negative voltage source, said amplifier output terminal, and the other of said two voltage source terminals for controlling the magnitude of voltage supplied from said negative source to said amplifier, said second voltage control circuit means including; third and fourth resistors of substantially equal values connected in series circuit relationship between said amplifier output terminal and said negative voltage source; a PNP type transistor having an emitter-collector circuit connected between said amplifier source terminal and said negative voltage source, the base electrode of said transistor being connected to the junction between said third and fourth resistors, the voltages at said amplifier output terminal and on one of said two voltage source terminals controlling the magnitude of voltage supplied from said positive voltage source to said amplifier.

References Cited

UNITED STATES PATENTS

| | | | |
|---|---|---|---|
| 3,233,185 | 2/1966 | Young | 330—40 X |
| 3,319,195 | 5/1967 | Dryden | 330—40 X |
| 3,426,290 | 2/1969 | Jensen | 330—40 |
| 3,427,560 | 2/1969 | Pincus | 330—69 |

ROY LAKE, Primary Examiner

J. B. MULLINS, Assistant Examiner

U.S. Cl. X.R.

330—38, 40

Disclaimer and Dedication 3,521,179.—*Timothy B. Blancke*, West Concord, Mass. AMPLIFIER WITH SOURCE VOLTAGE CONTROL. Patent dated July 21, 1970. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]